United States Patent
Chen

(10) Patent No.: US 10,958,815 B1
(45) Date of Patent: Mar. 23, 2021

(54) FOLDED FLEX CIRCUIT BOARD FOR CAMERA ESD PROTECTION

(71) Applicant: Apple Inc., Cupertino, CA (US)

(72) Inventor: Chih-Jen Chen, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/122,810

(22) Filed: Sep. 5, 2018

Related U.S. Application Data

(60) Provisional application No. 62/555,004, filed on Sep. 6, 2017.

(51) Int. Cl.
*H04N 5/225* (2006.01)
*H05K 1/18* (2006.01)
*H05K 1/02* (2006.01)
*G06F 3/041* (2006.01)

(52) U.S. Cl.
CPC ......... *H04N 5/2257* (2013.01); *H04N 5/2254* (2013.01); *H05K 1/0259* (2013.01); *H05K 1/189* (2013.01); *G06F 3/0416* (2013.01); *H05K 2201/10121* (2013.01); *H05K 2201/10151* (2013.01)

(58) Field of Classification Search
CPC ...... H05K 1/028; H05K 1/0281; H05K 1/118; H05K 1/147; H05K 1/189; H05K 2201/056; H04N 5/2252–2258; G02B 13/001–009
See application file for complete search history.

(56) References Cited

U.S. PATENT DOCUMENTS

| | | | |
|---|---|---|---|
| 9,167,161 B1* | 10/2015 | Tam | H04N 5/2253 |
| 9,569,654 B2 | 2/2017 | Benkley, III | |
| 2006/0055016 A1 | 3/2006 | Tiao | |
| 2007/0120050 A1* | 5/2007 | Sawahata | H01L 27/14618 250/239 |
| 2008/0252774 A1* | 10/2008 | Chen | H04N 5/2254 348/374 |
| 2012/0315953 A1* | 12/2012 | Du | H04N 5/2257 455/556.1 |
| 2014/0036218 A1* | 2/2014 | Yu | H04N 5/2257 349/200 |
| 2014/0043524 A1* | 2/2014 | Azuma | H04N 5/232 348/357 |
| 2015/0077629 A1* | 3/2015 | Jeong | H04N 5/2254 348/374 |
| 2016/0165125 A1* | 6/2016 | Kim | G03B 3/10 348/345 |
| 2016/0353616 A1 | 12/2016 | Dinh et al. | |

FOREIGN PATENT DOCUMENTS

KR 101224662 6/2008

* cited by examiner

*Primary Examiner* — Paul M Berardesca
(74) *Attorney, Agent, or Firm* — Kowert, Hood, Munyon, Rankin & Goetzel, P.C.; Robert Kowert

(57) ABSTRACT

Various embodiments disclosed herein include a folded flex circuit board that may be used in a camera module. In some embodiments, the folded flex circuit board may include a base portion and one or more tab portions that extend from the base portion. In various examples, the folded flex circuit board may be folded such that the tab portion(s) form at least a portion of one or more sides of a camera module. According to some embodiments, the folded flex circuit board may be configured to provide electrostatic discharge (ESD) protection to the camera module.

26 Claims, 8 Drawing Sheets

FOLDED FLEX CIRCUIT BOARD FOR CAMERA ESD PROTECTION

This application claims benefit of priority to U.S. Provisional Application No. 62/555,004, filed Sep. 6, 2017, titled "Folded Flex Circuit Board for Camera ESD Protection," which is herein incorporated by reference in its entirety.

BACKGROUND

Technical Field

This disclosure relates generally to folded flex circuit boards for providing electrostatic discharge (ESD) protection to cameras.

Description of the Related Art

The advent of small, mobile multipurpose devices such as smartphones and tablet or pad devices has resulted in a need for high-resolution, small form factor cameras for integration in the devices. However, due to limitations of conventional camera technology, conventional small cameras used in such devices tend to capture images at lower resolutions and/or with lower image quality than can be achieved with larger, higher quality cameras. Achieving higher resolution with small package size cameras generally requires use of a photosensor with small pixel size and a good, compact imaging lens system. Advances in technology have achieved reduction of the pixel size in photosensors. However, as photosensors become more compact and powerful, demand for compact imaging lens systems with improved imaging quality performance has increased.

SUMMARY OF EMBODIMENTS

In some embodiments, a camera module may include a lens, an image sensor, and a flex circuit board. The lens may include one or more lens elements. The image sensor may be configured to capture light that has passed through the lens. The flex circuit board may include a base portion and one or more tab portions that extend from the base portion. In some examples, the base portion may be coupled to the image sensor and/or a substrate that holds the image sensor. In various embodiments, the flex circuit board may be folded such that the tab portion(s) are non-parallel to the base portion and/or the image sensor. The flex circuit board may be configured to provide, at least in part, ESD protection to the camera module in some examples.

In some embodiments, a folded flex circuit board (e.g., for a camera module) may include a base portion and one or more tab portions. The base portion may provide at least a portion of a bottom of the camera module and may be configured to be coupled to an image sensor and/or a substrate that holds the image sensor. The tab portion(s) may extend from the base portion to provide at least a portion of one or more sides of the camera module. In some examples, the tab portion(s) may be configured to be coupled to a shield can of the camera module. In various embodiments, the folded flex circuit board may be folded such that the tab portion(s) are non-parallel to the base portion and/or the image sensor. In various embodiments, the folded flex circuit board is configured to provide, at least in part, ESD protection to the camera module.

In some embodiments, a method of manufacturing a camera module may include attaching a base portion of a flex circuit board to a bottom side of a substrate that holds an image sensor of the camera module. Furthermore, the method may include attaching one or more tab portions of the flex circuit board to one or more sides of a shield can. The shield can may cover at least a portion of the camera module. In various embodiments, the tab portion(s) may extend from the base portion.

According to some examples, the base portion of the flex circuit board may be attached to the bottom side of the substrate (that holds the image sensor) via a conductive adhesive, such that the flex circuit board is capable of receiving signals, from the image sensor, through the substrate. In some examples, each of the tab portion(s) of the flex circuit board may be attached to a respective side of the shield can.

In some embodiments, a device (e.g., a mobile multifunction device) may include a camera module and one or more processors. The camera module may include a lens, an image sensor, and a flex circuit board. The lens may include one or more lens elements. The image sensor may be configured to capture light that has passed through the lens. The flex circuit board may include a base portion and one or more tab portions that extend from the base portion. In some cases, the base portion of the flex circuit board may be coupled to the image sensor and/or a substrate that holds the image sensor. In various embodiments, the tab portion(s) of the flex circuit board may be folded such that the tab portion(s) are non-parallel to the base portion. In some examples, the flex circuit board may be configured to provide, at least in part, ESD protection to the camera module. According to various embodiments, the processor(s) may be in electrical communication with the flex circuit board.

BRIEF DESCRIPTION OF THE DRAWINGS

FIG. 4A shows a perspective view of the flex circuit board in a flat configuration. FIG. 4B shows a perspective view of the flex circuit board in a folded configuration.

Figure 1:
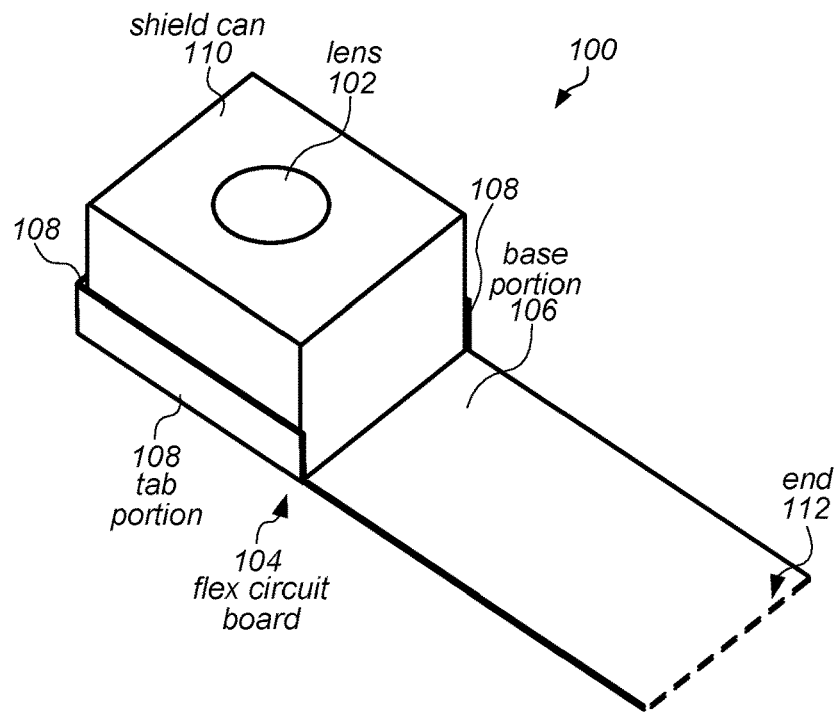
FIG. 1 illustrates a perspective view of an example camera module that includes a folded flex circuit board, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

Various embodiments disclosed herein include a folded flex circuit board for a camera system (which may also be referred to herein as a "camera" or a "camera module"). In some cases, the flex circuit board may be configured to provide electrostatic discharge (ESD) protection to a camera module. Some existing camera designs include a stiffener (e.g., a metal stiffener) to provide mechanical support and/or mechanical protection to one or more components of the camera (e.g., to a flex circuit board). In various embodiments, a camera module that includes a folded flex circuit board as described herein may not include such a stiffener. For instance, in contrast to some existing camera designs, no stiffener may be located along a bottom surface of the folded flex circuit board in various embodiments described herein. As such, the z dimension of camera modules that include such the folded flex circuit board may be reduced by at least the thickness of the stiffener that would otherwise be used. Instead of the stiffener, the folded flex circuit board may provide mechanical support and/or mechanical protection to at least a portion of the camera module. Furthermore, in some existing camera designs, the stiffener may form part of a ground path. In embodiments disclosed herein, camera modules may form a ground path without the use of a stiffener, thereby reducing the number of interfaces in the ground path.

In some embodiments, a camera module may include a lens, an image sensor, and a flex circuit board. The lens may include one or more lens elements. The image sensor may be configured to capture light that has passed through the lens. The flex circuit board may include a base portion and one or more tab portions that extend from the base portion. In some examples, the base portion may be coupled to the image sensor and/or a substrate that holds the image sensor. In various embodiments, the flex circuit board may be folded such that the tab portion(s) are non-parallel to the base portion and/or the image sensor. The flex circuit board may be configured to provide, at least in part, ESD protection to the camera module in some examples.

According to various embodiments, the base portion of the flex circuit board may provide a bottom of the camera module. In some cases, the tab portion(s) of the flex circuit board may include a first tab portion, a second tab portion, and a third tab portion. The first tab portion, the second tab portion, and/or the third tab portion may be oriented orthogonal to the base portion in some instances. Furthermore, according to some embodiments, the second tab portion may be located opposite the first tab portion. In some non-limiting examples, no tab portions may be located opposite the third tab portion.

In some embodiments, the base portion of the flex circuit board may extend along a plane that is parallel to the image sensor and/or orthogonal to an optical axis of the lens. Furthermore, the tab portion(s) of the flex circuit board may be oriented perpendicular to the image sensor in some examples.

In some examples, the camera module may include one or more components that cover a top portion of the camera module. For example, a shield can of the camera module may cover the top portion. In various embodiments, the tab(s) of the flex circuit board may be coupled to the shield can (and/or coupled to other component(s) covering the top portion of the camera module). In some examples, the tab(s) of the flex circuit board may be attached to the shield can via a conductive material (e.g., a conductive adhesive such as silver paste). Furthermore, the flex circuit board may comprise a conductive material. For instance, the conductive material may be embedded within the flex circuit board. In some embodiments, the flex circuit board and/or the conductive material may be configured to bridge a ground path between the substrate and the shield can.

In some examples, the flex circuit board may be in electrical contact with the image sensor and/or the substrate that holds the image sensor, such that the flex circuit board is capable of receiving signals from the image sensor.

In some examples, no stiffener may be located opposite the substrate (that holds the image sensor) with respect to a plane defined by the flex circuit board.

In some cases, the camera module may include an actuator (e.g., a voice coil motor (VCM) actuator) to move the lens relative to the image sensor. For instance, the actuator may move the lens along an optical axis of the camera module and/or in one or more directions orthogonal to the optical axis.

In some embodiments, a folded flex circuit board (e.g., for a camera module) may include a base portion and one or more tab portions. The base portion may provide at least a portion of a bottom of the camera module and may be configured to be coupled to an image sensor and/or a substrate that holds the image sensor. The tab portion(s) may extend from the base portion to provide at least a portion of one or more sides of the camera module. In some examples, the tab portion(s) may be configured to be coupled to a shield can of the camera module. In various embodiments, the folded flex circuit board may be folded such that the tab portion(s) are non-parallel to the base portion and/or the image sensor. In various embodiments, the folded flex circuit board is configured to provide, at least in part, ESD protection to the camera module.

In some cases, the base portion of the folded flex circuit board may be configured to be coupled to the substrate that holds the image sensor, such that the base portion extends along a plane that is parallel to the image sensor. The tab portion(s) of the folded flex circuit board may be configured to be coupled to the shield can such that the tab portion(s) are oriented perpendicular to the image sensor. In some instances, the folded flex circuit board may comprise conductive material configured to form a ground path from the substrate (that holds the image sensor) to the shield can.

In some embodiments, a method of manufacturing a camera module may include attaching a base portion of a flex circuit board to a bottom side of a substrate that holds an image sensor of the camera module. Furthermore, the method may include attaching one or more tab portions of the flex circuit board to one or more sides of a shield can. The shield can may cover at least a portion of the camera module. In various embodiments, the tab portion(s) may extend from the base portion.

In some implementations, the method may include forming the flex circuit board from a flat substrate. Forming the flex circuit board may include providing conductive material in the flex circuit board such that the flex circuit board is configured to bridge, via the conductive material, a ground path between the substrate (that holds the image sensor) and the shield can. Furthermore, the method may include folding the flex circuit board such that the tab portion(s) are oriented at a non-zero angle to the base portion.

According to some examples, the base portion of the flex circuit board may be attached to the bottom side of the substrate (that holds the image sensor) via a conductive adhesive, such that the flex circuit board is capable of receiving signals, from the image sensor, through the substrate. In some examples, each of the tab portion(s) of the flex circuit board may be attached to a respective side of the shield can.

In some embodiments, a device (e.g., a mobile multifunction device) may include a camera module and one or more processors. The camera module may include a lens, an image sensor, and a flex circuit board. The lens may include one or more lens elements. The image sensor may be configured to capture light that has passed through the lens. The flex circuit board may include a base portion and one or more tab portions that extend from the base portion. In some cases, the base portion of the flex circuit board may be coupled to the image sensor and/or a substrate that holds the image sensor. In various embodiments, the tab portion(s) of the flex circuit board may be folded such that the tab portion(s) are non-parallel to the base portion. In some examples, the flex circuit board may be configured to provide, at least in part, ESD protection to the camera module.

According to various embodiments, the processor(s) may be in electrical communication with the flex circuit board. For instance, the flex circuit board may be configured to receive signals from the image sensor (e.g., via the substrate that holds the image sensor), and convey the signals to the processor(s). In some examples, the processor(s) may be located external to the camera module. The base portion of the flex circuit board may provide a bottom of the camera module, and may extend beyond the camera module to the processor(s) and/or one or more other components (e.g., components of the device that are external to the camera module) that are in electrical communication with the processor(s).

In some cases, the device may include a display. In some instances, the processor(s) may be configured to cause the camera module to capture an image via the image sensor. Furthermore, the processor(s) may be configured to cause the display to present the image.

In some embodiments, the device may include multiple camera modules. For instance, the device may include a first camera module and a second camera module that are adjacent to one another. In some examples, the first camera module and the second camera module may have different focal lengths.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

FIG. 1 illustrates a perspective view of an example camera module 100 that includes a folded flex circuit board, in accordance with some embodiments. In some embodiments, the camera module 100 may include one or multiple features, components, and/or functionality of embodiments described herein with reference to FIGS. 2-9.

In some embodiments, the camera module 100 may include a lens 102, an image sensor (e.g., the image sensor 304 shown in FIG. 3), and a flex circuit board 104. The lens 102 may include one or more lens elements. The image sensor may be configured to capture light that has passed through the lens 102. The flex circuit board 104 may include a base portion 106 and one or more tab portions 108 that extend from the base portion 106. In some examples, the base portion 106 may be coupled to the image sensor and/or a substrate (e.g., the substrate 304 shown in FIG. 3) that holds the image sensor, e.g., as described below with reference to FIG. 3.

In various embodiments, the flex circuit board 104 may be folded such that the tab portion(s) 108 are non-parallel to (and/or oriented at a non-zero angle to) the base portion 106 and/or the image sensor. For instance, as shown in FIG. 1, the tab portion(s) 108 may be oriented perpendicular to the base portion 106. However, the tab portion(s) 108 may be oriented at any other suitable angle to the base portion 106. Furthermore, in some cases, the flex circuit board 104 may have tab portions 108 that are oriented at multiple different angles to the base portion 106. While FIG. 1 shows tab portions 108 that are planar, the flex circuit board 104 may have tab portions 108 that are shaped differently in some embodiments. For instance, the tab portions 108 may be curved and/or include a curved portion.

In some embodiments, the flex circuit board 104 may be configured to provide electrostatic discharge (ESD) protection to the camera module 100. According to various embodiments, the base portion 106 of the flex circuit board 104 may provide and/or cover a bottom of the camera module 100. The tab portion(s) 108 of the flex circuit board 104 may provide and/or cover, at least in part, one or more sides of the camera module 100. As shown in FIG. 1, the flex circuit board 104 may include multiple tab portions 108 that each provide and/or cover a portion of a respective side of the camera module 100. Furthermore, in various examples, there may be no tab portions located opposite at least one of the tab portions 108.

In some examples, one or more components may cover a top portion of the camera module 100. For instance, the camera module 100 may include a shield can 110 that covers the top portion. The tab portion(s) 108 of the flex circuit board 104 may be coupled to the shield can 110 in some embodiments. In some cases, each of the tab portion(s) 108 may be attached to a respective side of the shield can 110. For instance, the tab portion(s) 108 may be attached to sides of the shield can 110 that extend along respective planes that are parallel to an optical axis of the camera module 100 (e.g., an optical axis of the lens 102).

According to some embodiments, at least one of the sides of the shield can 110, e.g., a side of the shield can 110 that extends along a plane parallel to the optical axis, may not have a tab portion attached to it. An end of the base portion 106 of the flex circuit board 108 may extend outwardly from below the side of the shield can 110 that is not attached to a tab portion, such that the flex circuit board 108 can be attached to one or more components that are exterior to the camera module 100.

Embodiments of the camera module 100 described herein may be implemented in a small package size while still capturing sharp, high-resolution images, making the camera module 100 suitable for use in small and/or mobile multi-function devices such as cell phones, smartphones, pad or tablet computing devices, laptop, netbook, notebook, sub-notebook, and ultrabook computers, and so on. However, note that aspects of the camera module 100 may be scaled up or down to provide cameras with larger or smaller package sizes. In some examples, the camera module 100 may be implemented as stand-alone digital cameras. In addition to still (single frame capture) camera applications, the camera module 100 may be adapted for use in video camera applications. In some embodiments, the camera module 100 may be included in a device along with one or more other camera modules such as a wider-field small format camera or a telephoto or narrow angle small format camera, which would for example allow the user to select between the different camera formats (e.g., normal, telephoto or wide-field) when capturing images with the device. In some embodiments, two or more small format camera modules as described herein may be included in a device, for example as front-facing and rear-facing cameras in a mobile device. In some examples, a first camera module of a camera system may be structurally and/or functionally different than a second camera module of the camera system that is proximate the first camera module. For example, the first camera module may include a folded flex circuit board as described herein, while the second camera module may not include a folded flex circuit board. In some examples, each of the first camera module and the second camera module may have a respective folded flex circuit board.

Figure 2:
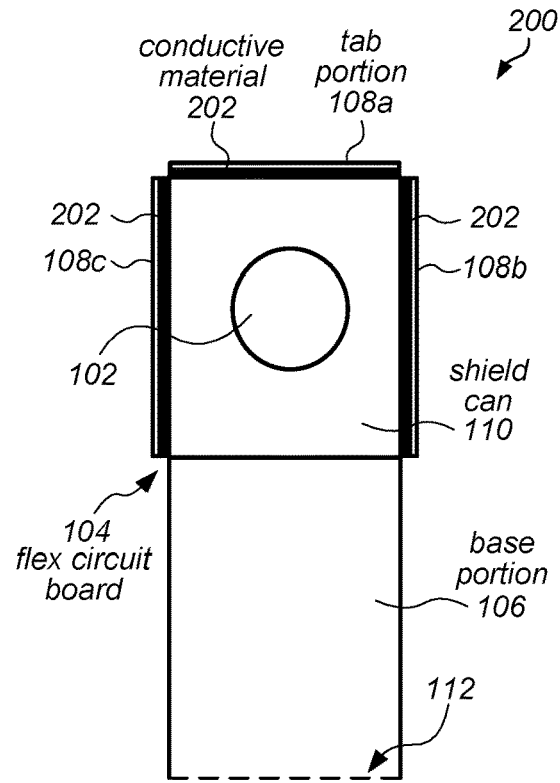
FIG. 2 illustrates a top view of an example camera module that includes a folded flex circuit board, in accordance with some embodiments.

FIG. 2 illustrates a top view of an example camera module 200 that includes a folded flex circuit board, in accordance with some embodiments. In some embodiments, the camera module 200 may include one or multiple features, components, and/or functionality of embodiments described herein with reference to FIGS. 1 and 3-9.

In some embodiments, the flex circuit board 104 may include a first tab portion 108a, a second tab portion 108b, and a third tab portion 108c. The flex circuit board 104 may be folded such that the first tab portion 108a, the second tab portion 108b, and/or the third tab portion 108c may be oriented perpendicular to the base portion 106. In some non-limiting examples, the tab portions 108a, 108b, 108c may be attached to the shield can 110 at three of four sides of the shield can 110 that radially surround the lens 102, e.g., as shown in FIG. 2. One side of the shield can 110 (e.g., the side opposite tab portion 108a) may not be attached to a tab portion of the flex circuit board 104. As such, the flex circuit board 104 may have an arrangement of tab portions that is asymmetric with respect to at least one axis that is orthogonal to an optical axis of the lens 102.

In various embodiments, each tab portion 108a, 108b, 108c of the flex circuit board 104 is attached to a respective side of the shield can 110 via a conductive material 202. In some instances, the conductive material 202 may be a conductive adhesive (e.g., silver paste) that may be used to adhere each tab portion 108a, 108b, 108c to a respective side of the shield can 110. As described below with reference to FIG. 3, the conductive material 202 may provide part of a ground path of the camera module 200, e.g., by bridging the ground path from the flex circuit board 104 to the shield can 110.

Figure 3:
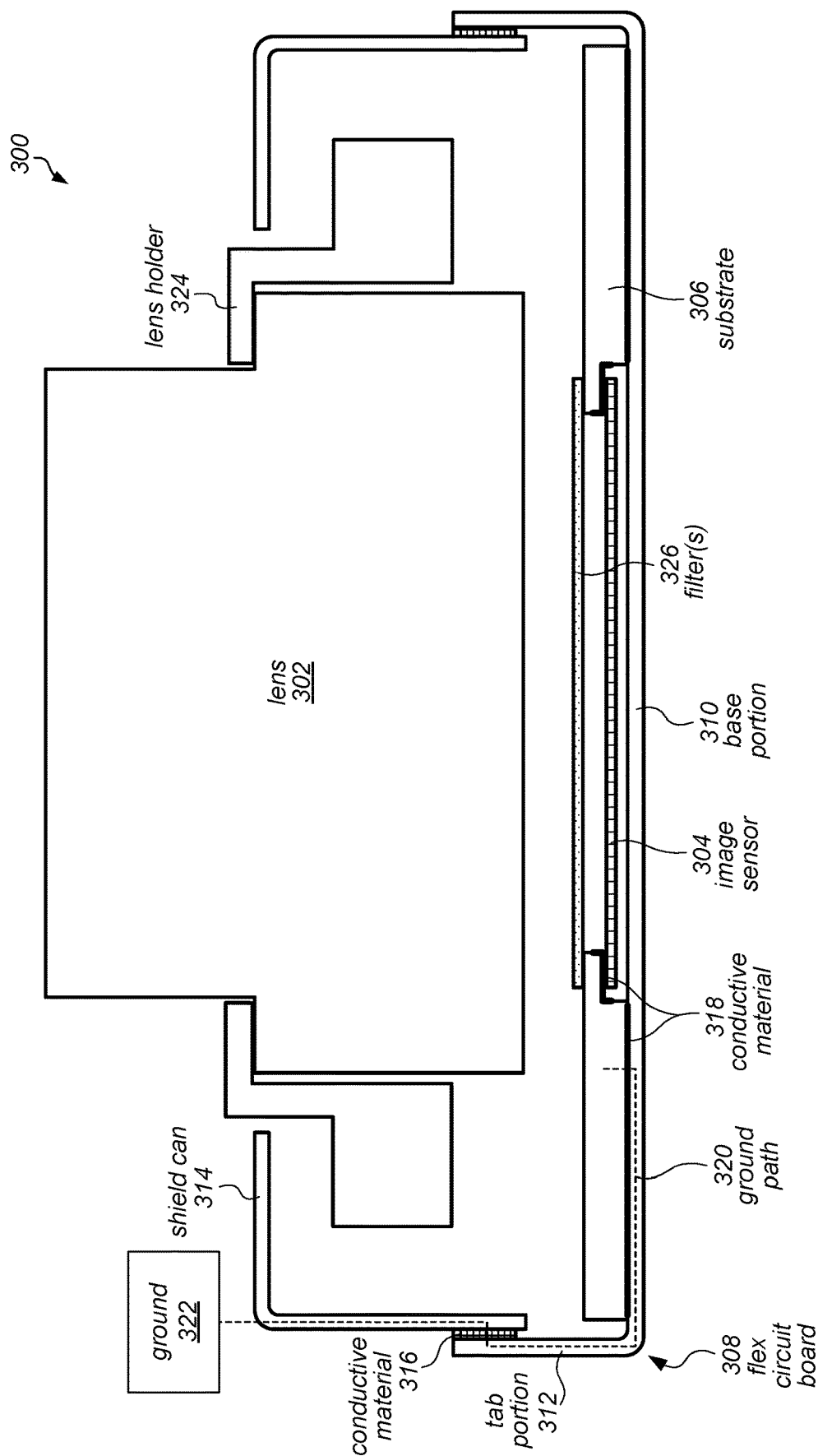
FIG. 3 illustrates a cross-sectional side view of an example camera module that includes a folded flex circuit board, in accordance with some embodiments.

FIG. 3 illustrates a cross-sectional side view of an example camera module 300 that includes a folded flex circuit board, in accordance with some embodiments. In some embodiments, the camera module 300 may include one or multiple features, components, and/or functionality of embodiments described herein with reference to FIGS. 1, 2, and 4A-10.

In various embodiments, the camera module 300 may include a lens 302, an image sensor 304, a substrate 306, and a flex circuit board 308. The lens 302 may include one or more lens elements. The image sensor 304 may be configured to capture light that has passed through the lens 102. The substrate 306 may hold the image sensor 304 in some embodiments. The flex circuit board 308 may include a base portion 310 and one or more tab portions 312 that extend from the base portion 310.

Figure 4A:
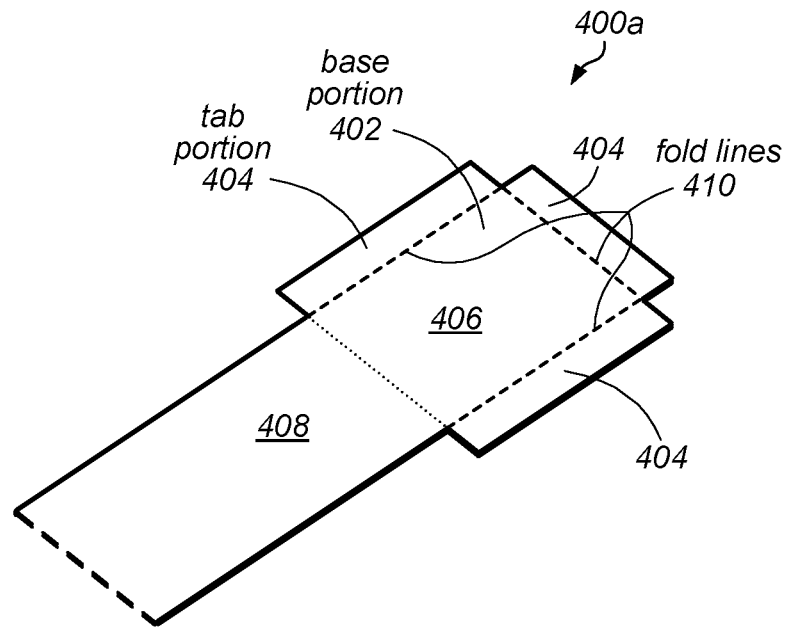
FIGS. 4A and 4B illustrate an example flex circuit board that may be used in a camera module, in accordance with some embodiments.
Figure 4B:
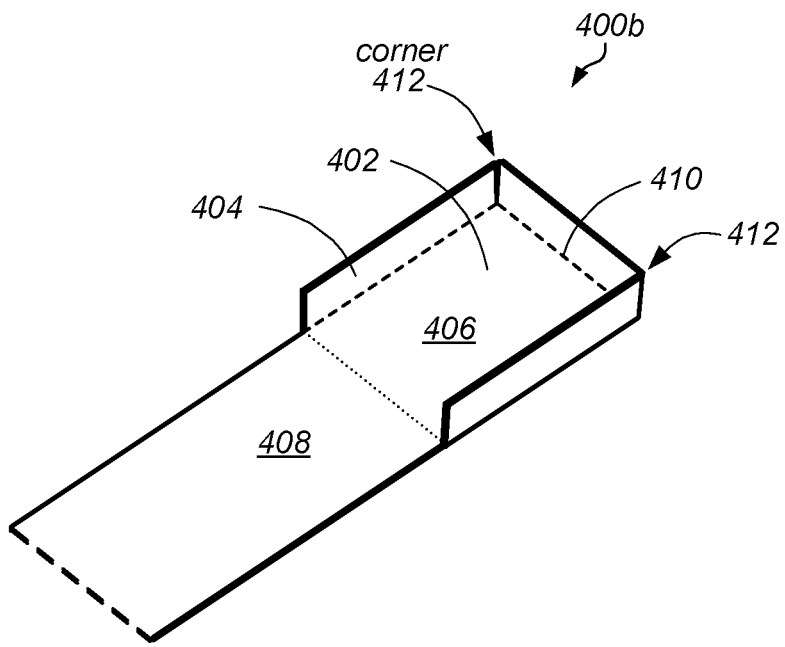

According to various examples, the flex circuit board 308 may be folded in certain locations (e.g., at fold lines 406 shown in FIGS. 4A and 4B). The flex circuit board 308 may include a base portion 310 and one or more tab portions 312, and the flex circuit board may be folded such that the tab portion(s) 312 are non-parallel to the base portion 310 and/or the image sensor 304. For instance, the tab portion(s) 312 may be oriented perpendicular to the base portion 310 and/or the image sensor 304 in some embodiments. According to some examples, the base portion 310 may be parallel to the image sensor 304. In some embodiments, the base portion 310 and/or the image sensor 304 may be oriented perpendicular to an optical axis of the lens 302. Additionally, or alternatively, the tab portion(s) 312 may be oriented parallel to the optical axis of the lens 302.

In some embodiments, the flex circuit board 308 may be configured to provide electrostatic discharge (ESD) protection to the camera module 300. For instance, as shown in FIG. 3, the flex circuit board 308 may provide an exterior cover along a portion of the exterior of the camera module 300. In some examples, the flex circuit board 308 may cover bottom and side portions of the camera module 308.

In some embodiments, the camera module 300 may include one or more components, other than the flex circuit board 308, that also provide an exterior cover along a portion of the exterior of the camera module 300. For example, the camera module 300 may include a shield can 314. The shield can 314 may cover top and side portions of the camera module 300 in some cases. In some examples, the shield can 314 may be considered to cover an upper portion of the camera module 300, and the flex circuit board 308 may be considered to cover a lower portion of the camera module 300, e.g., as shown in FIG. 3.

The flex circuit board 308 may be coupled to the shield can 314 in various embodiments. For instance, each of the tab portion(s) 312 of the flex circuit board 308 may be attached to a respective side of the shield can 314. In some examples, the tab portion(s) may be attached to the shield can 314 via a conductive material 316. For example, the conductive material 316 may be a conductive adhesive, such as a silver paste, in some embodiments. However, other types of conductive material 316 may be used in various embodiments. In some instances, the conductive material 316 may be injected or otherwise disposed within a region between the tab portion(s) and the shield can 314, such that the conductive material 316 is in contact with a respective inner surface of each tab portion 312 and a corresponding portion of an outer surface of the shield can 314.

According to some embodiments, conductive material 318 may also be disposed at other locations, e.g., as shown in FIG. 3, such that certain components are in electrical contact with one another. The conductive material 318 may be of the same type as the conductive material 316 used to attach the flex circuit board 308 to the shield can 314 in some cases. However, the conductive material 318 may be of a different type in various embodiments. In some examples, conductive material 318 may be located between the image sensor 304 and the substrate 306 such that the image sensor 304 and the substrate 306 are in electrical contact with one another. As such, electric current may flow between the image sensor 304 and the substrate 306. In some examples, conductive material 318 may be located between the substrate 306 and the flex circuit board 308. For instance, conductive material 318 may be located between a bottom surface of the substrate 306 and a top surface of the base portion 310 of the flex circuit board 308. As such, electric current may flow between the substrate 306 and the flex circuit board 308.

In various embodiments, the camera module 300 may have a ground path 320 for electric current to flow to ground 322, e.g., as indicated by the broken line in FIG. 3. As discussed above, current may flow from the image sensor 304 to the substrate 306 via conductive material 318. Current may flow along the ground path 320 from the substrate 306 to the flex circuit board 308 via conductive material 318. Furthermore, current may flow along the ground path 320 from the flex circuit board 308 to the shield can 314 via conductive material 316. Furthermore, current may flow along the ground path 320 from the shield can 314 to ground 322. In some examples, one or more other components may be part of the ground path 320 to ground 322, e.g., between the shield can 314 and ground 322. In various embodiments, the flex circuit board 308 may include conductive material 318 to allow current to flow along the flex circuit board 308 towards the shield can 314. For instance, the flex circuit board 308 may include a ground plane of conductive material that extends from the base portion 310 to the tab portion(s) 312, such that current can flow from the base portion 310 to the tab portion(s) 312.

According to various embodiments, signals may be conveyed from the image sensor 304 to the substrate 306 via conductive material 318. Furthermore, the signals may be conveyed from the substrate 306 to the flex circuit board 308 via conductive material 318. The signals may be conveyed from the flex circuit board 308 to one or more other components with which the flex circuit board 308 is in electrical communication. For instance, the flex circuit board 308 may be in electrical communication with one or more components that are exterior to the camera module 300 in some embodiments. As an example, the camera module 300 may be part of a device, and the flex circuit board 308 may be in electrical communication with a controller (e.g., optical sensor controller 758 shown in FIG. 7) and/or one more processors of the device via the base portion 310 of the flex circuit board 308.

Some existing camera designs include a stiffener (e.g., a metal stiffener) to provide mechanical support and/or mechanical protection to one or more components of the camera (e.g., to a flex circuit board). In various embodiments, the camera module 300 may not include such a stiffener. For instance, in contrast to some existing camera designs, in various embodiments no stiffener may be located opposite the substrate 306 (that holds the image sensor 304) with respect to a plane defined by the flex circuit board 308. That is, no stiffener may be located along a bottom surface of the flex circuit board 308 in various embodiments. As such, the z dimension (e.g., along the optical axis of the lens 302) of the camera module 300 may be reduced by at least the thickness of the stiffener that would otherwise be used. Instead of the stiffener, the flex circuit board 308 may provide mechanical support and/or mechanical protection to at least a portion of the camera module 300. Furthermore, in some existing camera designs, the stiffener may form part of a ground path. In embodiments disclosed herein, the camera module 300 may form part of a ground path (e.g., ground path 320) without the use of a stiffener.

In some cases, the camera module 300 may include an actuator (not shown) to move the lens relative to the image sensor. For instance, the actuator may be a voice coil motor (VCM) actuator that includes one or more magnets and one or more coils. However, one or more other types of actuators (and/or combinations of types of actuators) may be used in various embodiments. The actuator may be configured to move the lens 302, relative to the image sensor 304, along an optical axis of the lens 302, e.g., to provide autofocus functionality to the camera module 300. Additionally, or alternatively, the actuator may be configured to move the lens 302, relative to the image sensor 304, in one or more directions orthogonal to the optical axis, e.g., to provide optical image stabilization (OIS) functionality to the camera module 300. The lens 302 may be attached to a lens holder 324 in some embodiments. According to some examples, the actuator may move the lens 302 together with the lens holder 324.

In some examples, the camera module 300 may include one or more filters 326 to filter light that passes through the lens 302 before it reaches the image sensor 304. For instance, the filter(s) 326 may include an ultraviolet (UV) filter. However, the filter(s) 326 may include other types of filters in some embodiments. In some embodiments, the filter(s) 326 may be attached to a top surface of the substrate 306.

FIGS. 4A and 4B illustrate an example flex circuit board 400 that may be used in a camera module, in accordance with some embodiments. FIG. 4A shows a perspective view of the flex circuit board 400a in a flat configuration. FIG. 4B shows a perspective view of the flex circuit board 400b in a folded configuration. In some embodiments, the flex circuit board 400 may include one or multiple features, components, and/or functionality of embodiments described herein with reference to FIGS. 1-3 and 5-9.

The flex circuit board 400 may include a base portion 402 and one or more tab portions 404 that extend from the base portion 402. The flex circuit board 400 may initially be formed in a flat shape, e.g., in the flat configuration shown in FIG. 4A. In the flat configuration, the tab portion(s) 404 of the flex circuit board 400a may extend parallel to the base portion 402. In some embodiments, the tab portion(s) 404 may extend from a first end portion 406 of the base portion 402. In some embodiments, the tab portion(s) 404 may not extend from a second end portion 408 (of the base portion 402) opposite the first end portion 406. In some examples, the first end portion 406 may be configured to form a bottom of a camera module, and the second end portion 408 may be configured to extend from the camera module to one or more other components exterior to the camera module.

Fold lines 410 are shown in FIGS. 4A and 4B to illustrate example locations at which the flex circuit board 400 may be folded to form a folded configuration, e.g., as shown in FIG. 4B. In some embodiments, the fold lines 410 may delimit the tab portion(s) 404. While the base portion 402 and the tab portion(s) 404 are shown in FIGS. 4A and 4B as being rectangular in shape, it should be understood that the base portion 402 and/or the tab portion(s) may be shaped differently in some embodiments. Furthermore, the fold lines 410 may have a different pattern than the fold line pattern indicated in FIGS. 4A and 4B in some embodiments.

In the folded configuration, respective edges of the tab portion(s) 404 of the flex circuit board 400b may meet or be proximate one another to form one or more corners 412, e.g., as shown in FIG. 4B. For instance, an edge of a first tab portion 404 may be adjacent to an edge of a second tab portion 404 that is oriented perpendicular to the first tab portion. The corner(s) 412 may be configured to correspond to one or more corners of a camera module in some embodiments.

Figure 5:
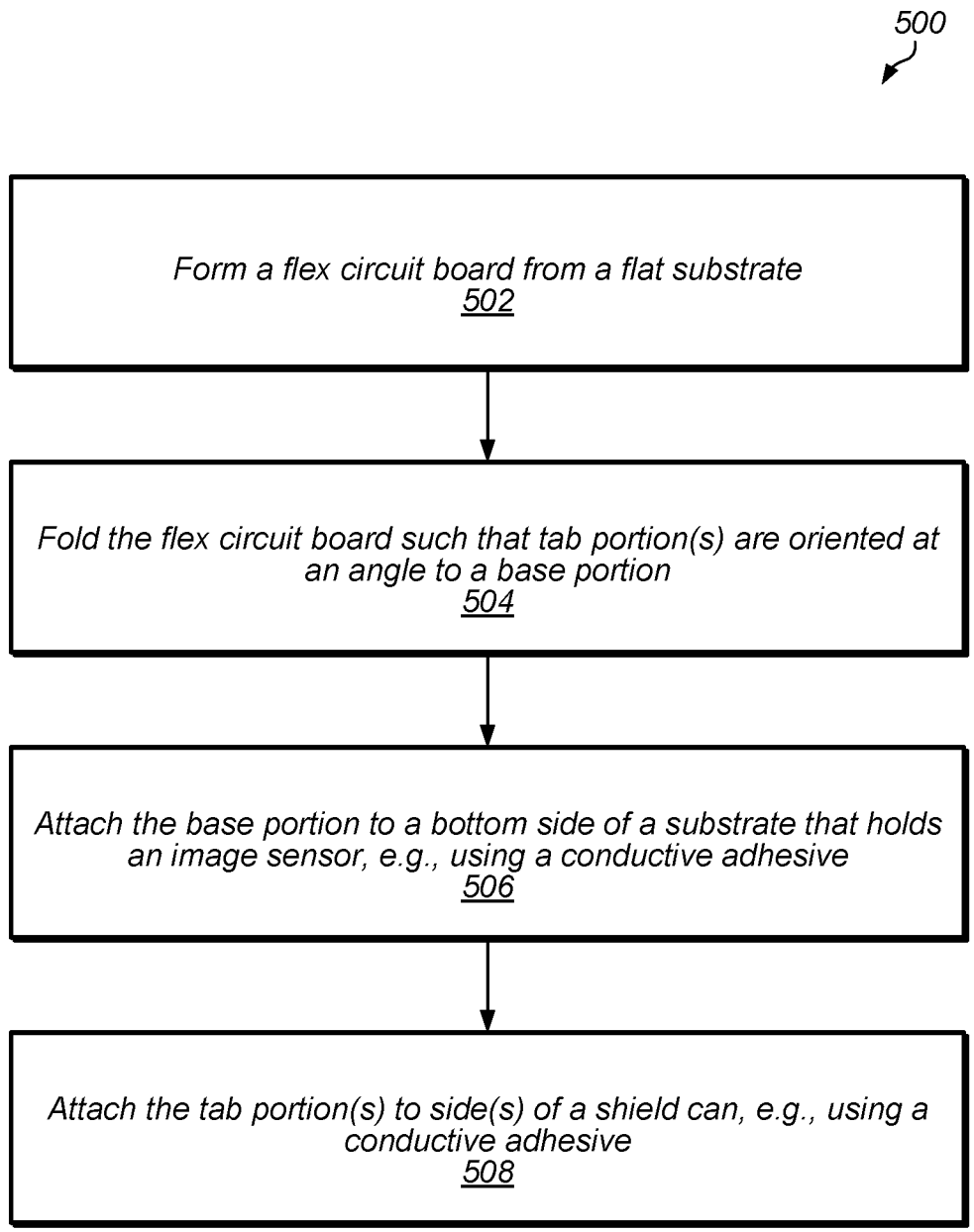
FIG. 5 is a flowchart of an example method of manufacturing a camera module that includes a folded flex circuit board, in accordance with some embodiments.

FIG. 5 is a flowchart of an example method 500 of manufacturing a camera module that includes a folded flex circuit board, in accordance with some embodiments. In some embodiments, the method 500 may include one or multiple features, components, and/or functionality of embodiments described herein with reference to FIGS. 1-4B and 6-9.

At 502, the method 500 may include forming a flex circuit board from a flat substrate. For instance, the flex circuit board may be formed from a flexible base material, such as a flexible polymer film (e.g., polyester (PET), polyimide (PI), etc.), to which other materials and/or components of the flex circuit board may be added. As a non-limiting example, the flex circuit board may be formed, at 502, to be in a flat configuration as described above with reference to FIG. 4A.

At 504, the method 500 may include folding the flex circuit board such that one or more tab portions of the flex circuit board are oriented at an angle to a base portion of the flex circuit board. For instance, the flex circuit board may be folded such that the tab portion(s) are non-parallel to the base portion. In some embodiments, the tab portion(s) may be perpendicular to the base portion and/or an image sensor of the camera module. As a non-limiting example, the flex circuit board may be folded, at 504, to be in a folded configuration as described above with reference to FIG. 4B.

At 506, the method 500 may include attaching the base portion of the flex circuit board to a bottom side of a substrate that holds an image sensor. For instance, a top side of the base portion may be attached to a bottom side of the substrate using a conductive adhesive, e.g., as described above with reference to FIG. 3.

At 508, the method 500 may include attaching the tab portion(s) of the flex circuit board to one or more sides of a shield can. For instance, the tab portion(s) may be attached to the side(s) of the shield can using a conductive adhesive, e.g., as described above with reference to FIG. 3.

In some embodiments, the flex circuit board may be folded (at 504) during or after the base portion of the flex circuit board is attached to the bottom side of the substrate that holds the image sensor (at 506). For instance, in some instances, the base portion of the flex circuit board may be attached to the bottom side of the substrate (at 506), then the flex circuit board may be folded (at 504), and then the tab portion(s) of the flex circuit board may be attached to the side(s) of the shield can (at 508). In other words, the flex circuit board may be folded (at 504) before assembly of components of the camera module in some instances, and in other instances the flex circuit board may be folded during assembly of components the camera module.

Figure 6:
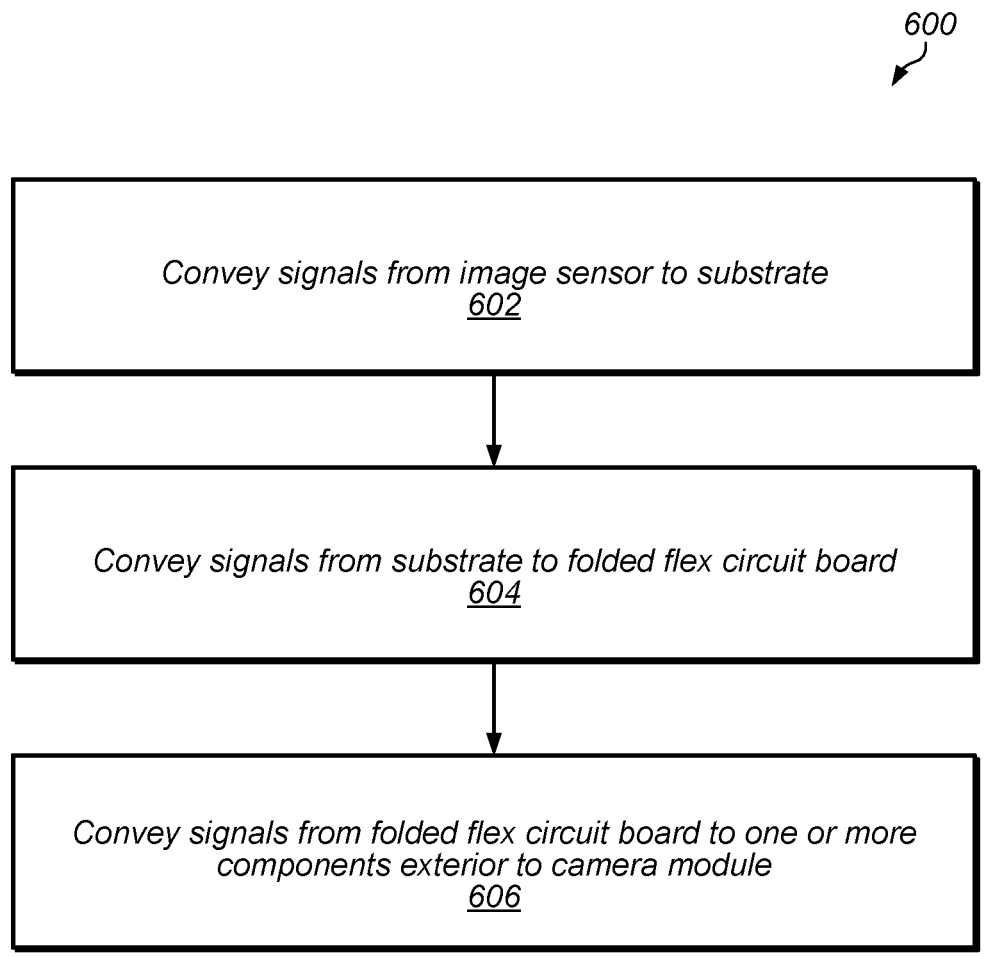
FIG. 6 is a flowchart of an example method of conveying signals from an image sensor to one or more other components via a folded flex circuit board that may be used in a camera module, in accordance with some embodiments.

FIG. 6 is a flowchart of an example method 600 of conveying signals from an image sensor to one or more other components via a folded flex circuit board that may be used in a camera module, in accordance with some embodiments.

In some embodiments, the method 600 may include one or multiple features, components, and/or functionality of embodiments described herein with reference to FIGS. 1-5 and 7-9.

At 602, the method 600 may include conveying signals from an image sensor to a substrate that holds the image sensor. For example, as described above with reference to FIG. 3, the image sensor 304 may be in electrical contact with the substrate 306 via a conductive material 318. As such, signals from the image sensor may be conveyed to the substrate 306 via the conductive material 318.

At 604, the method 600 may include conveying the signals from the substrate to a folded flex circuit board. For example, as described above with reference to FIG. 3, the substrate 306 may be in electrical contact with the flex circuit board 308 via a conductive material 318. As such, signals from the substrate 306 may be conveyed to the flex circuit board 308. As described with reference to FIG. 4B, for example, the folded flex circuit board may include a base portion 402 and one or more tab portions 404, and may be folded such that the tab portion(s) 404 are non-parallel to the base portion 402.

At 606, the method 600 may include conveying the signals from the folded flex circuit board to one or more components that are exterior to the camera module. For example, as described above with reference to FIG. 3, the flex circuit board 308 may be in electrical communication with one or more components (e.g., a controller) that are exterior to the camera module 300 in some embodiments. As such, the signals may be conveyed from the flex circuit board 308 to those components that are exterior to the camera module 300.

Multifunction Device Examples

Figure 7:
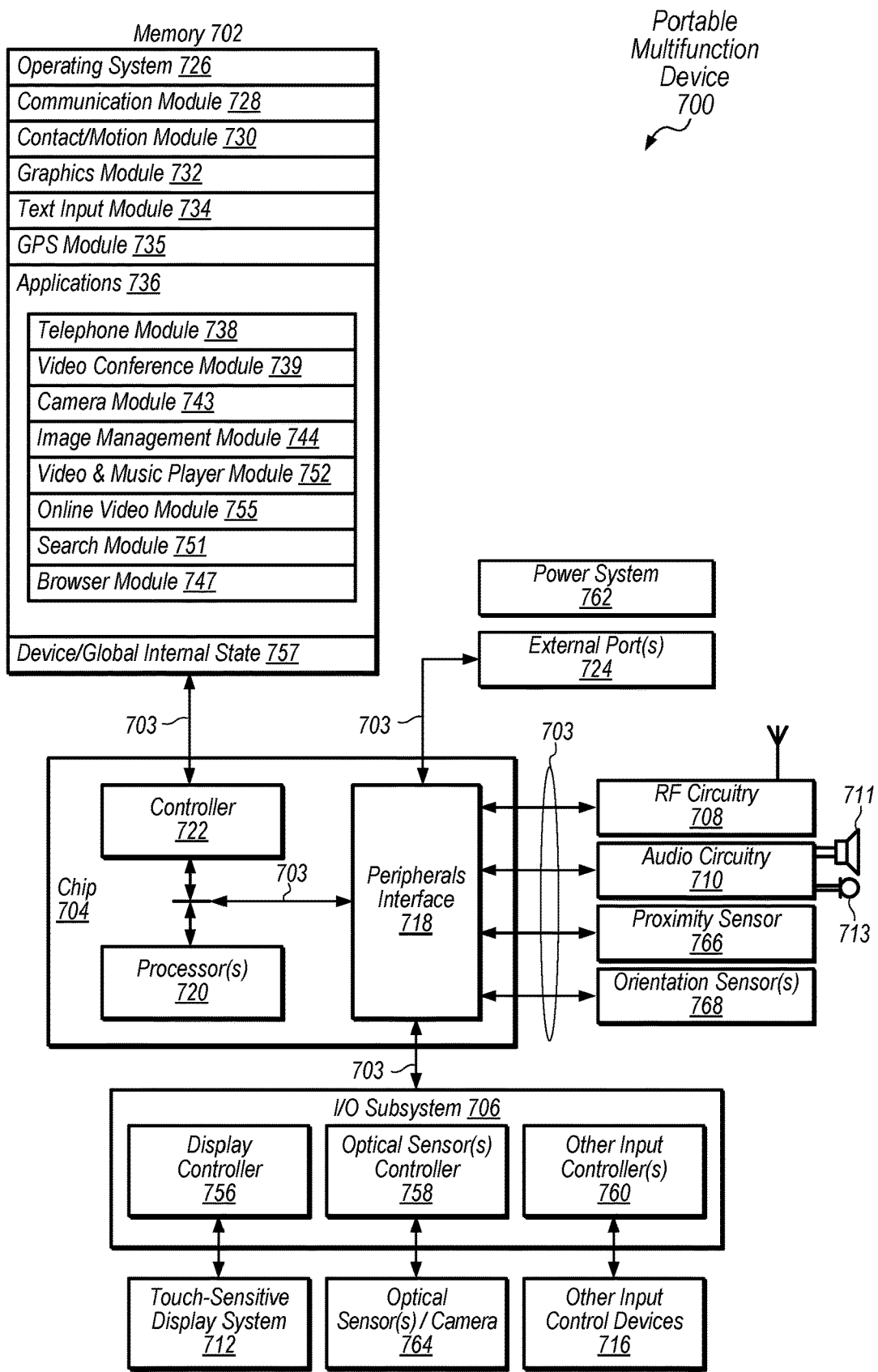
FIG. 7 illustrates a block diagram of a portable multifunction device that may include a camera module with a folded flex circuit board, in accordance with some embodiments.

FIG. 7 illustrates a block diagram of a portable multifunction device 700 that may include a camera module with a folded flex circuit board, in accordance with some embodiments. In some embodiments, the portable multifunction device 700 may include one or multiple features, components, and/or functionality of embodiments described herein with reference to FIGS. 1-6, 8, and 9.

In some embodiments, the device 700 is a portable communications device, such as a mobile telephone, that also contains other functions, such as PDA, camera, video capture and/or playback, and/or music player functions. Example embodiments of portable multifunction devices include, without limitation, the iPhone®, iPod Touch®, and iPad® devices from Apple Inc. of Cupertino, Calif. Other portable electronic devices, such as laptops, cell phones, smartphones, pad or tablet computers with touch-sensitive surfaces (e.g., touch screen displays and/or touch pads), may also be used. It should also be understood that, in some embodiments, the device is not a portable communications device, but is a desktop computer with a touch-sensitive surface (e.g., a touch screen display and/or a touch pad). In some embodiments, the device is a gaming computer with orientation sensors (e.g., orientation sensors in a gaming controller). In other embodiments, the device is not a portable communications device, but is a camera and/or video camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device 700 typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, a streaming video application, and/or a digital video player application.

The various applications that may be executed on the device 700 may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Device 700 may include memory 702 (which may include one or more computer readable storage mediums), memory controller 722, one or more processing units (CPU's) 720, peripherals interface 718, RF circuitry 708, audio circuitry 710, speaker 711, touch-sensitive display system 712, microphone 713, input/output (I/O) subsystem 706, other input control devices 716, and external port 724. Device 700 may include one or more optical sensors or cameras 764 (e.g., one or more embodiments of the cameras described herein). These components may communicate over one or more communication buses or signal lines 703. In some non-limiting examples, device 700 may include a first camera module 764(a) and/or a second camera module 764(b). According to some embodiments, the first camera module 764(a) may be located adjacent to the second camera module 764(b).

It should be appreciated that device 700 is only one example of a portable multifunction device, and that device 700 may have more or fewer components than shown, may combine two or more components, or may have a different configuration or arrangement of the components. The various components shown in FIG. 7 may be implemented in hardware, software, or a combination of hardware and software, including one or more signal processing and/or application specific integrated circuits.

Memory 702 may include high-speed random access memory and may also include non-volatile memory, such as one or more magnetic disk storage devices, flash memory devices, or other non-volatile solid-state memory devices. Access to memory 702 by other components of device 700, such as CPU 720 and the peripherals interface 718, may be controlled by memory controller 722.

Peripherals interface 718 can be used to couple input and output peripherals of the device to CPU 720 and memory 702. The one or more processors 720 run or execute various software programs and/or sets of instructions stored in memory 702 to perform various functions for device 700 and to process data.

In some embodiments, peripherals interface 718, CPU 720, and memory controller 722 may be implemented on a single chip, such as chip 704. In some other embodiments, they may be implemented on separate chips.

RF (radio frequency) circuitry 708 receives and sends RF signals, also called electromagnetic signals. RF circuitry 708 converts electrical signals to/from electromagnetic signals and communicates with communications networks and other communications devices via the electromagnetic signals. RF circuitry 708 may include well-known circuitry for performing these functions, including but not limited to an antenna system, an RF transceiver, one or more amplifiers, a tuner, one or more oscillators, a digital signal processor, a coder/decoder (codec) chipset, a subscriber identity module (SIM) card, memory, and so forth. RF circuitry 708 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 710, speaker 711, and microphone 713 provide an audio interface between a user and device 700. Audio circuitry 710 receives audio data from peripherals interface 718, converts the audio data to an electrical signal, and transmits the electrical signal to speaker 711. Speaker 711 converts the electrical signal to audible sound waves. Audio circuitry 710 also receives electrical signals converted by microphone 713 from sound waves. Audio circuitry 710 converts the electrical signal to audio data and transmits the audio data to peripherals interface 718 for processing. Audio data may be retrieved from and/or transmitted to memory 702 and/or RF circuitry 708 by peripherals interface 718. In some embodiments, audio circuitry 710 also includes a headset jack. The headset jack provides an interface between audio circuitry 710 and removable audio input/output peripherals, such as output-only headphones or a headset with both output (e.g., a headphone for one or both ears) and input (e.g., a microphone).

I/O subsystem 706 couples input/output peripherals on device 700, such as touch screen 712 and other input control devices 716, to peripherals interface 718. I/O subsystem 706 may include display controller 756 and one or more input controllers 760 for other input control devices 716. The one or more input controllers 760 receive/send electrical signals from/to other input control devices 716. The other input control devices 716 may include physical buttons (e.g., push buttons, rocker buttons, etc.), dials, slider switches, joysticks, click wheels, and so forth. In some alternative embodiments, input controller(s) 760 may be coupled to any (or none) of the following: a keyboard, infrared port, USB port, and a pointer device such as a mouse. The one or more buttons may include an up/down button for volume control of speaker 711 and/or microphone 713. The one or more buttons may include a push button.

Touch-sensitive display 712 provides an input interface and an output interface between the device and a user. Display controller 756 receives and/or sends electrical signals from/to touch screen 712. Touch screen 712 displays visual output to the user. The visual output may include graphics, text, icons, video, and any combination thereof (collectively termed "graphics"). In some embodiments, some or all of the visual output may correspond to user-interface objects.

Touch screen 712 has a touch-sensitive surface, sensor or set of sensors that accepts input from the user based on haptic and/or tactile contact. Touch screen 712 and display controller 756 (along with any associated modules and/or sets of instructions in memory 702) detect contact (and any movement or breaking of the contact) on touch screen 712 and converts the detected contact into interaction with user-interface objects (e.g., one or more soft keys, icons, web pages or images) that are displayed on touch screen 712. In an example embodiment, a point of contact between touch screen 712 and the user corresponds to a finger of the user.

Touch screen 712 may use LCD (liquid crystal display) technology, LPD (light emitting polymer display) technology, or LED (light emitting diode) technology, although other display technologies may be used in other embodiments. Touch screen 712 and display controller 756 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 712. In an example embodiment, projected mutual capacitance sensing technology is used, such as that found in the iPhone®, iPod Touch®, and iPad® from Apple Inc. of Cupertino, Calif.

Touch screen 712 may have a video resolution in excess of 100 dpi. In some embodiments, the touch screen has a video resolution of approximately 160 dpi. The user may make contact with touch screen 712 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen 712, device 700 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 712 or an extension of the touch-sensitive surface formed by the touch screen.

Device 700 also includes power system 762 for powering the various components. Power system 762 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 700 may also include one or more optical sensors or cameras 764. FIG. 7 shows an optical sensor coupled to optical sensor controller 758 in I/O subsystem 706. Optical sensor 764 may, for example, include charge-coupled device (CCD) or complementary metal-oxide semiconductor (CMOS) phototransistors or photosensors. Optical sensor 764 receives light from the environment, projected through one or more lenses, and converts the light to data representing an image. In conjunction with imaging module 743 (also called a camera module), optical sensor 764 may capture still images and/or video sequences. In some embodiments, at least one optical sensor may be located on the back of device 700, opposite touch screen display 712 on the front of the device. In some embodiments, the touch screen display may be used as a viewfinder for still and/or video image acquisition. In some embodiments, at least one optical sensor may instead or also be located on the front of the device.

Device 700 may also include one or more proximity sensors 766. FIG. 7 shows proximity sensor 766 coupled to peripherals interface 718. Alternatively, proximity sensor 766 may be coupled to input controller 760 in I/O subsystem 706. In some embodiments, the proximity sensor turns off and disables touch screen 712 when the multifunction device is placed near the user's ear (e.g., when the user is making a phone call).

Device 700 may also include one or more orientation sensors 768. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 700. In some embodiments, the one or more orientation sensors include any combination of orientation/rotation sensors. FIG. 7 shows the one or more orientation sensors 768 coupled to peripherals interface 718. Alternatively, the one or more orientation sensors 768 may be coupled to an input controller 760 in I/O subsystem 706. In some embodiments, information is displayed on the touch screen display in a portrait view or a landscape view based on an analysis of data received from the one or more orientation sensors.

In some embodiments, device 700 may also include one or more other sensors (not shown) including but not limited to ambient light sensors and motion detectors. These sensors may be coupled to peripherals interface 718 or, alternatively, may be coupled to an input controller 760 in I/O subsystem 706. For example, in some embodiments, device 700 may include at least one forward-facing (away from the user) and at least one backward-facing (towards the user) light sensors that may be used to collect ambient lighting metrics from the environment of the device 700 for use in video and image capture, processing, and display applications.

In some embodiments, the software components stored in memory 702 include operating system 726, communication module 728, contact/motion module (or set of instructions) 730, graphics module 732, text input module 734, Global Positioning System (GPS) module 735, and applications 736. Furthermore, in some embodiments memory 702 stores device/global internal state 757. Device/global internal state 757 includes one or more of: active application state, indicating which applications, if any, are currently active; display state, indicating what applications, views or other information occupy various regions of touch screen display 712; sensor state, including information obtained from the device's various sensors and input control devices 716; and location information concerning the device's location and/or attitude.

Operating system 726 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 728 facilitates communication with other devices over one or more external ports 724 and also includes various software components for handling data received by RF circuitry 708 and/or external port 724. External port 724 (e.g., Universal Serial Bus (USB), FIRE-WIRE, etc.) is adapted for coupling directly to other devices or indirectly over a network (e.g., the Internet, wireless LAN, etc.). In some embodiments, the external port is a multi-pin (e.g., 30-pin) connector that is the same as, or similar to and/or compatible with the 30-pin connector used on iPod (trademark of Apple Inc.) devices.

Contact/motion module 730 may detect contact with touch screen 712 (in conjunction with display controller 756) and other touch sensitive devices (e.g., a touchpad or physical click wheel). Contact/motion module 730 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 730 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multi-touch"/multiple finger contacts). In some embodiments, contact/motion module 730 and display controller 756 detect contact on a touchpad.

Contact/motion module 730 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 732 includes various software components for rendering and displaying graphics on touch screen 712 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 732 stores data representing graphics to be used. Each graphic may be assigned a corresponding code. Graphics module 732 receives, from applications etc., one or more codes specifying graphics to be displayed along with, if necessary, coordinate data and other graphic property data, and then generates screen image data to output to display controller 756.

Text input module 734, which may be a component of graphics module 732, provides soft keyboards for entering text in various applications that need text input.

GPS module 735 determines the location of the device and provides this information for use in various applications (e.g., to telephone module 738 for use in location-based dialing, to camera module 743 as picture/video metadata, and to applications that provide location-based services such as map/navigation applications).

Applications 736 may include one or more of, but are not limited to, the following modules (or sets of instructions), or a subset or superset thereof:
  telephone module 738;
  video conferencing module 739;
  camera module 743 for still and/or video imaging;
  image management module 744;
  browser module 747;
  search module 751;
  video and music player module 752, which may be made up of a video player module and a music player module; and/or
  online video module 755.
  one or more other modules not shown, such as a gaming module.

Examples of other applications 736 that may be stored in memory 702 include but are not limited to other word processing applications, other image editing applications, drawing applications, presentation applications, communication/social media applications, map applications, JAVA-enabled applications, encryption, digital rights management, voice recognition, and voice replication.

In conjunction with RF circuitry 708, audio circuitry 710, speaker 711, microphone 713, touch screen 712, display controller 756, contact module 730, graphics module 732, and text input module 734, telephone module 738 may be used to enter a sequence of characters corresponding to a telephone number, access one or more telephone numbers in an address book, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 708, audio circuitry 710, speaker 711, microphone 713, touch screen 712, display controller 756, optical sensor 764, optical sensor controller 758, contact/motion module 730, graphics module 732, text input module 734, and telephone module 738, videoconferencing module 739 includes executable instructions to initiate, conduct, and terminate a video conference between a user and one or more other participants in accordance with user instructions.

In conjunction with touch screen 712, display controller 756, optical sensor(s) 764, optical sensor controller 758, contact/motion module 730, graphics module 732, and image management module 744, camera module 743 includes executable instructions to capture still images or video (including a video stream) and store them into memory 702, modify characteristics of a still image or video, or delete a still image or video from memory 702.

In conjunction with touch screen 712, display controller 756, contact/motion module 730, graphics module 732, text input module 734, and camera module 743, image management module 744 includes executable instructions to arrange, modify (e.g., edit), or otherwise manipulate, label, delete, present (e.g., in a digital slide show or album), and store still and/or video images.

In conjunction with RF circuitry 708, touch screen 712, display system controller 756, contact/motion module 730, graphics module 732, and text input module 734, browser module 747 includes executable instructions to browse the Internet in accordance with user instructions, including searching, linking to, receiving, and displaying web pages or portions thereof, as well as attachments and other files linked to web pages.

In conjunction with touch screen 712, display system controller 756, contact/motion module 730, graphics module 732, and text input module 734, search module 751 includes executable instructions to search for text, music, sound, image, video, and/or other files in memory 702 that match one or more search criteria (e.g., one or more user-specified search terms) in accordance with user instructions.

In conjunction with touch screen 712, display system controller 756, contact/motion module 730, graphics module 732, audio circuitry 710, speaker 711, RF circuitry 708, and browser module 747, video and music player module 752 includes executable instructions that allow the user to download and play back recorded music and other sound files stored in one or more file formats, such as MP3 or AAC files, and executable instructions to display, present or otherwise play back videos (e.g., on touch screen 712 or on an external, connected display via external port 724). In some embodiments, device 700 may include the functionality of an MP3 player, such as an iPod (trademark of Apple Inc.).

In conjunction with touch screen 712, display system controller 756, contact/motion module 730, graphics module 732, audio circuitry 710, speaker 711, RF circuitry 708, text input module 734, and browser module 747, online video module 755 includes instructions that allow the user to access, browse, receive (e.g., by streaming and/or download), play back (e.g., on the touch screen or on an external, connected display via external port 724), and otherwise manage online videos in one or more video formats, such as the H.264/AVC format or the H.265/HEVC format.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise rearranged in various embodiments. In some embodiments, memory 702 may store a subset of the modules and data structures identified above. Furthermore, memory 702 may store additional modules and data structures not described above.

In some embodiments, device 700 is a device where operation of a predefined set of functions on the device is performed exclusively through a touch screen and/or a touchpad. By using a touch screen and/or a touchpad as the primary input control device for operation of device 700, the number of physical input control devices (such as push buttons, dials, and the like) on device 700 may be reduced.

The predefined set of functions that may be performed exclusively through a touch screen and/or a touchpad include navigation between user interfaces. In some embodiments, the touchpad, when touched by the user, navigates device 700 to a main, home, or root menu from any user interface that may be displayed on device 700. In such embodiments, the touchpad may be referred to as a "menu button." In some other embodiments, the menu button may be a physical push button or other physical input control device instead of a touchpad.

Figure 8:
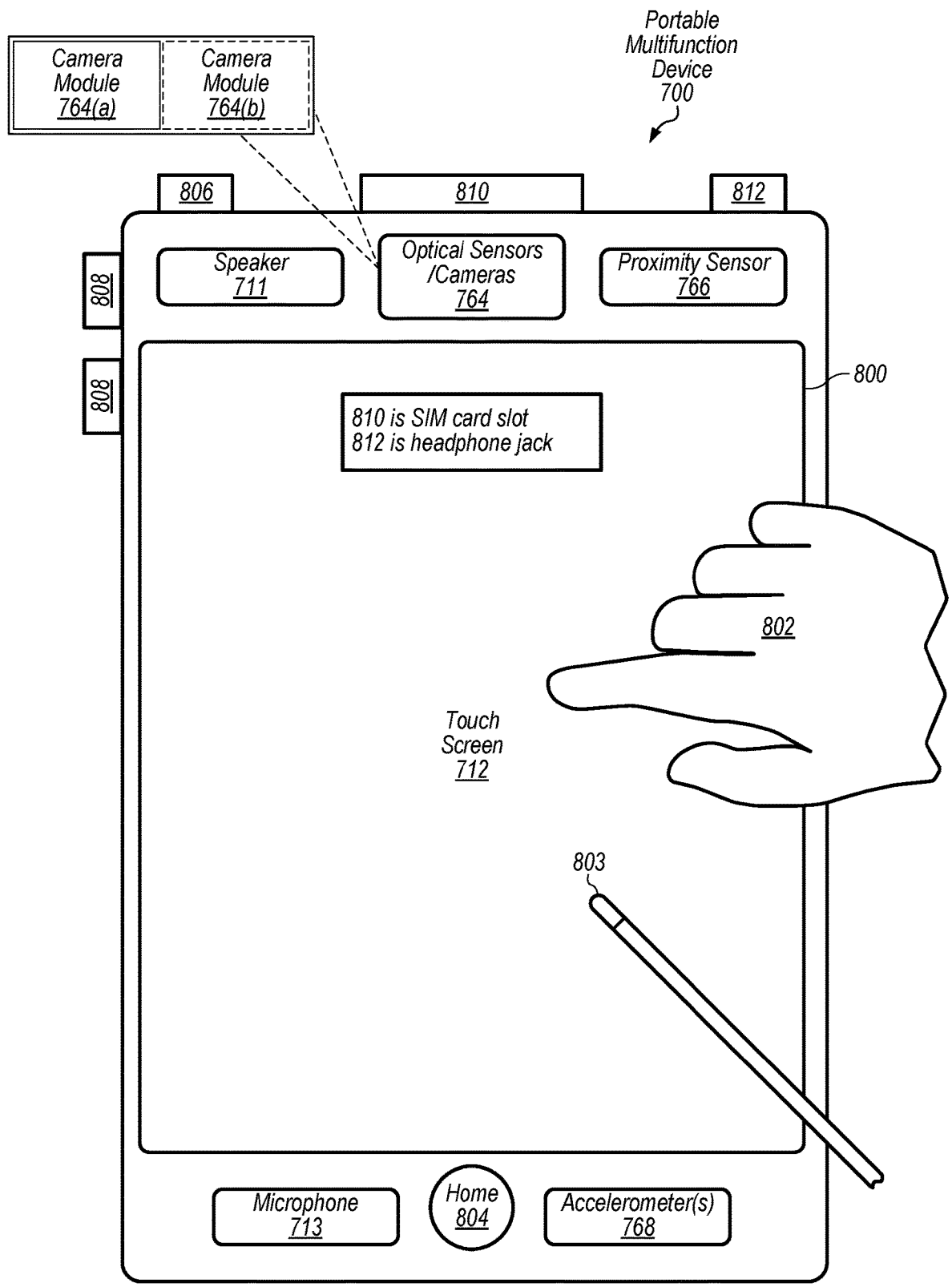
FIG. 8 depicts a portable multifunction device that may include a camera module with a folded flex circuit board, in accordance with some embodiments.

FIG. 8 depicts a portable multifunction device 700 that may include a camera module with a folded flex circuit board, in accordance with some embodiments. In some embodiments, the portable multifunction device 700 may include one or multiple features, components, and/or functionality of embodiments described herein with reference to FIGS. 1-7 and 9.

The device 700 may have a touch screen 712. The touch screen 712 may display one or more graphics within user interface (UI) 800. In this embodiment, as well as others described below, a user may select one or more of the graphics by making a gesture on the graphics, for example, with one or more fingers 802 (not drawn to scale in the figure) or one or more styluses 803 (not drawn to scale in the figure).

Device 700 may also include one or more physical buttons, such as "home" or menu button 704. As described previously, menu button 804 may be used to navigate to any application 736 in a set of applications that may be executed on device 700. Alternatively, in some embodiments, the menu button 804 is implemented as a soft key in a GUI displayed on touch screen 712.

In one embodiment, device 700 includes touch screen 712, menu button 804, push button 806 for powering the device on/off and locking the device, volume adjustment button(s) 808, Subscriber Identity Module (SIM) card slot 810, head set jack 812, and docking/charging external port 724. Push button 806 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 700 also may accept verbal input for activation or deactivation of some functions through microphone 713.

It should be noted that, although many of the examples herein are given with reference to optical sensor(s)/camera(s) 764 (on the front of a device), one or more rear-facing cameras or optical sensors that are pointed opposite from the display may be used instead of, or in addition to, an optical sensor(s)/camera(s) 764 on the front of a device.

Example Computer System

Figure 9:
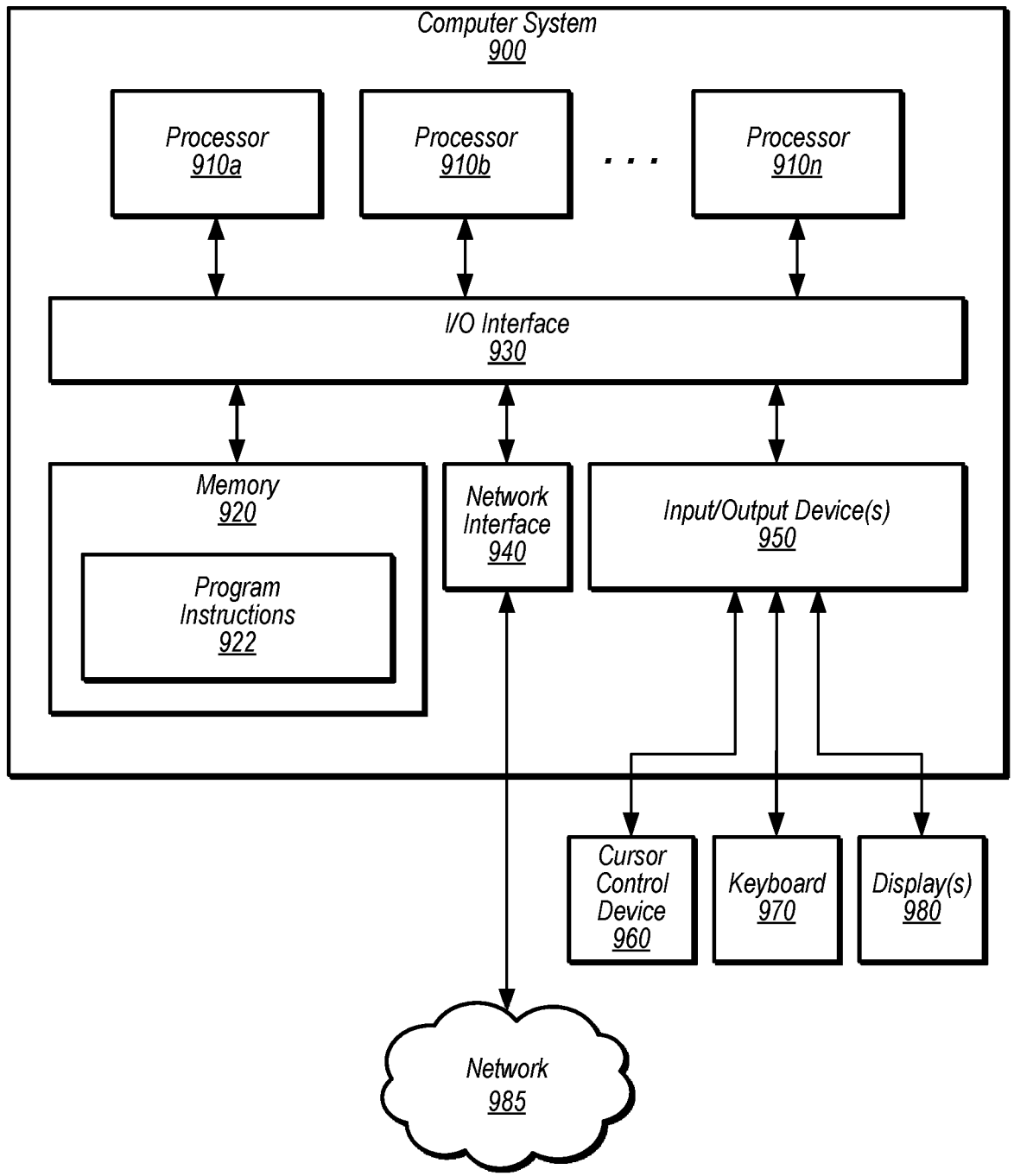
FIG. 9 illustrates an example computer system that may include a camera module with a folded flex circuit board, in accordance with some embodiments.

FIG. 9 illustrates an example computer system 900 that may include a camera module with a folded flex circuit board, in accordance with some embodiments. In some embodiments, the computer system 900 may include one or multiple features, components, and/or functionality of embodiments described herein with reference to FIGS. 1-8.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 900, which may interact with various other devices. Note that any component, action, or functionality described above with respect to FIGS. 1-8 may be implemented on one or more computers configured as computer system 900 of FIG. 9, according to various embodiments. In the illustrated embodiment, computer system 900 includes one or more processors 910 coupled to a system memory 920 via an input/output (I/O) interface 930. Computer system 900 further includes a network interface 940 coupled to I/O interface 930, and one or more input/output devices 950, such as cursor control device 960, keyboard 970, and display(s) 980. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 910, or a multiprocessor system including several processors 910 (e.g., two, four, eight, or another suitable number). Processors 910 may be any suitable processor capable of executing instructions. For example, in various embodiments processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 910 may commonly, but not necessarily, implement the same ISA.

System memory 920 may be configured to store program instructions 922 accessible by processor 910. In various embodiments, system memory 920 may be implemented using any suitable memory technology, such as static random access memory (SRAM), synchronous dynamic RAM (SDRAM), nonvolatile/Flash-type memory, or any other type of memory. Additionally, existing camera control data 932 of memory 920 may include any of the information or data structures described above. In some embodiments, program instructions and/or data may be received, sent or stored upon different types of computer-accessible media or on similar media separate from system memory 920 or computer system 900. While computer system 900 is described as implementing the functionality of functional blocks of previous figures, any of the functionality described herein may be implemented via such a computer system.

In one embodiment, I/O interface 930 may be configured to coordinate I/O traffic between processor 910, system memory 920, and any peripheral devices in the device, including network interface 940 or other peripheral interfaces, such as input/output devices 950. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices attached to a network 985 (e.g., carrier or agent devices) or between nodes of computer system 900. Network 985 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 940 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 950 may, in some embodiments, include one or more display terminals, keyboards, keypads, touchpads, scanning devices, voice or optical recognition devices, or any other devices suitable for entering or accessing data by one or more computer systems 900. Multiple input/output devices 950 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 940.

As shown in FIG. 9, memory 920 may include program instructions 922, which may be processor-executable to implement any element or action described above. In one embodiment, the program instructions may implement the methods described above. In other embodiments, different elements and data may be included. Note that data may include any data or information described above.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 900 may be transmitted to computer system 900 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera module, comprising:
   a shield can that covers a portion of the camera module;
   a lens comprising one or more lens elements;
   an image sensor configured to capture light that has passed through the lens; and
   a flex circuit board, comprising:
   a base portion coupled to at least one of the image sensor or a substrate that holds the image sensor, such that the camera module is configured to convey image signals, from the image sensor, via the flex circuit board; and
   one or more tab portions that extend from the base portion;
   wherein the flex circuit board is folded such that the one or more tab portions form at least a portion of one or more sides of the camera module, and wherein the one or more tab portions are conductively attached to an outer side of the shield can to bridge a ground path to the shield can.

2. The camera module of claim 1, wherein the flex circuit board is configured to provide, at least in part, electrostatic discharge (ESD) protection to the camera module.

3. The camera module of claim 1, wherein:
the base portion provides a bottom of the camera module;
the one or more tab portions comprise:
a first tab portion that is oriented orthogonal to the base portion;
a second tab portion that is oriented orthogonal to the base portion and is located opposite the first tab portion; and
a third tab portion that is oriented orthogonal to the base portion; and
no tab portions of the one or more tab portions are located opposite the third tab portion.

4. The camera module of claim 1, wherein:
the base portion extends along a plane that is parallel to the image sensor and orthogonal to an optical axis of the lens; and
the one or more tab portions are oriented perpendicular to the image sensor.

5. The camera module of claim 1, further comprising conductive material disposed between the flex circuit board and at least one of the image sensor or the substrate, wherein the flex circuit board is in electrical contact with the at least one of the image sensor or the substrate via the conductive material, such that the flex circuit board is capable of receiving signals from the image sensor.

6. The camera module of claim 1, wherein no stiffener is located opposite the substrate with respect to a plane defined by the flex circuit board.

7. The camera module of claim 1, wherein the shield can covers a top portion of the camera module.

8. The camera module of claim 7, wherein the flex circuit board comprises a conductive material configured to bridge the ground path between the substrate and the shield can.

9. The camera module of claim 7, wherein the one or more tab portions of the flex circuit board are conductively attached to the shield can via a conductive adhesive.

10. The camera module of claim 1, further comprising:
an actuator configured to move the lens relative to the image sensor.

11. A folded flex circuit board for a camera module, the folded flex circuit board comprising:
a base portion to provide at least a portion of a bottom of the camera module, wherein the base portion is configured to be coupled to at least one of an image sensor or a substrate that holds the image sensor, such that the camera module is configured to convey image signals, from the image sensor, via the folded flex circuit board; and
a plurality of tab portions that extends from the base portion;
wherein the folded flex circuit board is folded such that the plurality of tab portions forms at least a portion of sides of the camera module, and wherein the plurality of tab portions is configured to attach to a shield can of the camera module at the sides.

12. The folded flex circuit board of claim 11, wherein the folded flex circuit board is configured to provide, at least in part, electrostatic discharge (ESD) protection to the camera module.

13. The folded flex circuit board of claim 11, wherein:
the base portion is configured to be coupled to the substrate such that the base portion extends along a plane that is parallel to the image sensor; and
the plurality of tab portions is configured to be coupled to the shield can such that the plurality of tab portions is oriented perpendicular to the image sensor.

14. The folded flex circuit board of claim 11, further comprising:
conductive material configured to form a ground path from the substrate to the shield can.

15. A method of manufacturing a camera module, the method comprising:
attaching a base portion of a flex circuit board to a bottom side of a substrate that holds an image sensor of the camera module, such that the camera module is configured to convey image signals, from the image sensor, via the flex circuit board;
conductively attaching one or more tab portions of the flex circuit board to one or more outer sides of a shield can that covers at least a portion of the camera module to bridge a ground path to the shield can, wherein the one or more tab portions extend from the base portion.

16. The method of claim 15, further comprising:
forming the flex circuit board from a flat substrate;
folding the flex circuit board such that the one or more tab portions are oriented at a non-zero angle to the base portion.

17. The method of claim 16, wherein the forming the flex circuit board comprises:
providing conductive material in the flex circuit board such that the flex circuit board is configured to bridge, via the conductive material, the ground path between the substrate and the shield can.

18. The method of claim 15, wherein the attaching the base portion comprises:
attaching the base portion to the bottom side of the substrate via a conductive adhesive, such that the flex circuit board is capable of receiving signals, from the image sensor, through the substrate.

19. The method of claim 15, wherein the conductively attaching the one or more tab portions comprises:
conductively attaching each of the one or more tab portions to a respective side of the one or more sides of the shield can.

20. A device, comprising:
a camera module, including:
a shield can that covers a portion of the camera module;
a lens comprising one or more lens elements;
an image sensor configured to capture light that has passed through the lens; and
a flex circuit board, comprising:
a base portion coupled to at least one of the image sensor or a substrate that holds the image sensor, such that the camera module is configured to convey image signals, from the image sensor, via the flex circuit board; and
a plurality of tab portions that extends from the base portion;
wherein the flex circuit board is folded such that the plurality of tab portions forms at least a portion of sides of the camera module, and wherein one or more tab portions of the plurality of tab portions are conductively attached to the shield can at one or more of the sides; and
one or more processors in electrical communication with the flex circuit board.

21. The device of claim 20, wherein the flex circuit board is configured to provide, at least in part, electrostatic discharge (ESD) protection to the camera module.

22. The device of claim 20, wherein the device is a mobile multifunction device.

23. The device of claim 20, wherein:
the device further comprises a display; and
the one or more processors are configured to:
cause the camera module to capture an image via the image sensor; and
cause the display to present the image.

24. The device of claim 20, wherein:
the camera module is a first camera module; and
the device further comprises a second camera module.

25. The device of claim 24, wherein the first camera module is located adjacent to the second camera module.

26. The camera module of claim 1, wherein a conductive adhesive is disposed within a region between the one or more tab portions and the shield can, such that the conductive adhesive is in contact with a respective inner surface of each of the one or more tab portions and a corresponding portion of an outer surface of the shield can.

* * * * *